(12) United States Patent
An et al.

(10) Patent No.: US 9,062,366 B2
(45) Date of Patent: Jun. 23, 2015

(54) MULTI-LAYERED ARTICLE AND METHOD OF FABRICATING THE SAME

(75) Inventors: Jin Soo An, ChungCheongNam-Do (KR); Jung Hong Oh, ChungCheongNam-Do (KR); Ho Woo Kim, ChungCheongNam-Do (KR); Jongkyun Lee, ChungCheongNam-Do (KR); Jae Hong Lee, ChungCheongNam-Do (KR)

(73) Assignee: Corning Precision Materials Co., Ltd. (KR)

( * ) Notice: Subject to any disclaimer, the term of this patent is extended or adjusted under 35 U.S.C. 154(b) by 934 days.

(21) Appl. No.: 13/207,001

(22) Filed: Aug. 10, 2011

(65) Prior Publication Data

US 2012/0040140 A1 Feb. 16, 2012

(30) Foreign Application Priority Data

Aug. 11, 2010 (KR) .................. 10-2010-0077332
Aug. 8, 2011 (KR) .................. 10-2011-0078718

(51) Int. Cl.
| | | |
|---|---|---|
| B32B 3/00 | (2006.01) |
| C23C 14/00 | (2006.01) |
| B32B 3/26 | (2006.01) |
| B32B 15/04 | (2006.01) |
| B32B 18/00 | (2006.01) |
| B44C 1/10 | (2006.01) |

(Continued)

(52) U.S. Cl.
CPC ..... *C23C 14/0015* (2013.01); *Y10T 428/24545* (2015.01); *Y10T 428/24529* (2015.01); *Y10T 428/24521* (2015.01); *B32B 3/263* (2013.01); *B32B 15/04* (2013.01); *B32B 18/00* (2013.01); *B44C 1/105* (2013.01); *B44C 1/227* (2013.01); *B44C 3/025* (2013.01); *C23C 14/024* (2013.01); *C23C 14/025* (2013.01); *C23C 14/083* (2013.01); *C23C 14/086* (2013.01); *C23C 14/18* (2013.01); *C23C 14/20* (2013.01); *B32B 3/30* (2013.01)

(58) Field of Classification Search
CPC .......... B32B 3/30; B44C 1/105; B44C 1/227; B44C 3/025
USPC .................. 428/156, 157, 161, 163, 167, 172, 428/195.1, 192, 209; 204/192.1
See application file for complete search history.

(56) References Cited

U.S. PATENT DOCUMENTS 4,837,072 A * 6/1989 Kraetschmer ................. 428/201
5,209,688 A * 5/1993 Nishigaki et al. ............... 445/24

(Continued)

FOREIGN PATENT DOCUMENTS

| CN | 101332690 A | 12/2008 |
| CN | 201288147 Y | 8/2009 |

(Continued)

*Primary Examiner* — Gerard Higgins
(74) *Attorney, Agent, or Firm* — Lerner, David, Littenberg, Krumholz & Mentlik, LLP

(57) ABSTRACT

A multi-layered article includes a substrate; a resin pattern layer; and a thin film coating layer. The substrate, the resin pattern layer, and the thin film coating layer are sequentially layered on each other. A protective film or a first protective coating layer is layered on a surface of the thin film coating layer that faces away from the resin pattern layer. A second protective coating layer is interposed between the thin film coating layer and the protective film or the first protective coating layer. A primer coating layer is interposed between the resin pattern layer and the thin film coating layer.

17 Claims, 12 Drawing Sheets

(51) Int. Cl.
*B44C 1/22* (2006.01)
*B44C 3/02* (2006.01)
*C23C 14/02* (2006.01)
*C23C 14/08* (2006.01)
*C23C 14/18* (2006.01)
*C23C 14/20* (2006.01)
*B32B 3/30* (2006.01)

(56) References Cited

U.S. PATENT DOCUMENTS

| | | | | |
|---|---|---|---|---|
| 5,270,097 | A | * | 12/1993 | Amemiya et al. ............ 428/156 |
| 5,714,231 | A | * | 2/1998 | Reinhart ........................ 428/156 |
| 7,510,456 | B2 | * | 3/2009 | D'Haene et al. ................ 445/24 |
| 7,612,727 | B2 | * | 11/2009 | Schwenke ...................... 343/713 |
| 7,713,633 | B2 | * | 5/2010 | Lingle et al. ................... 428/432 |
| 2002/0081424 | A1 | | 6/2002 | Haas et al. |
| 2003/0054177 | A1 | * | 3/2003 | Jin ................................. 428/432 |
| 2008/0012493 | A1 | * | 1/2008 | Lee et al. ....................... 313/582 |

FOREIGN PATENT DOCUMENTS

| | | |
|---|---|---|
| DE | 4341162 A1 | 6/1994 |
| DE | 102006035688 A1 | 1/2008 |
| EP | 1216847 A2 | 6/2002 |

* cited by examiner

100

MULTI-LAYERED ARTICLE AND METHOD OF FABRICATING THE SAME

CROSS REFERENCE TO RELATED APPLICATION

The present application claims priority from Korean Patent Application Numbers 10-2010-0077332 filed on Aug. 11, 2010 and 10-2011-0078718 filed on Aug. 8, 2011, the entire contents of which application are incorporated herein for all purposes by this reference.

BACKGROUND OF THE INVENTION

1. Field of the Invention

The present invention relates to a multi-layered article and a method of fabricating the same, and more particularly, to a multi-layered article having a thin film coating layer and a method of fabricating the same.

2. Description of Related Art

Recently, design competitiveness has become a key factor in determining the competitive power of products. For example, in home appliances (e.g., refrigerators, air conditioners, and display devices) and the like, efforts are being concentrated on enhancing market competitiveness by introducing differentiated designs. A decorative multi-layered article is adhered to the body of a home appliance for the purpose of differentiating the design of the home appliance, in order to increase the competitiveness of the home appliance.

FIG. 1 is a view showing the structure of a multi-layered article of the related art.

As shown in FIG. 1, the multi-layered article of the related art includes a substrate 10, a pattern layer 20' and a printed layer 30. The pattern layer 20' is formed on the rear surface of the substrate 10. The printed layer 30 is formed on the rear surface of the pattern layer 20'. The printed layer 30 typically uses mirror ink. However, this type of printed layer 30 has limitation in giving rich colors and depth, and more particularly, rich metal colors and feeling. In addition, the mirror ink is expensive, and thus becomes a factor that increases the unit price of the multi-layered article.

The information disclosed in this Background of the Invention section is only for the enhancement of understanding of the background of the invention, and should not be taken as an acknowledgment or any form of suggestion that this information forms a prior art that would already be known to a person skilled in the art.

BRIEF SUMMARY OF THE INVENTION

Various aspects of the present invention are to increase the competitiveness of a product by imparting the impression of rich color and depth to a multi-layered article.

In an aspect of the present invention, a multi-layered article includes a substrate; a resin pattern layer; and a thin film coating layer. The substrate, the resin pattern layer, and the thin film coating layer are sequentially layered on each other.

The multi-layered article may further include a protective film or a first protective coating layer layered on a surface of the thin film coating layer that faces away from the resin pattern layer. The multi-layered article may further include a second protective coating layer interposed between the thin film coating layer and the protective film or between the thin film coating layer and the first protective coating layer.

It is preferred that the multi-layered article may further include a primer coating layer interposed between the resin pattern layer and the thin film coating layer.

According to embodiments of the present invention provide, the multi-layered article has the effect of being able to clearly exhibit a rich sense of color and depth and provide refinement.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Reference will now be made in detail to various embodiments of the present invention, examples of which are illustrated in the accompanying drawings and described below. While the invention will be described in conjunction with exemplary embodiments, it is to be understood that the present description is not intended to limit the invention to those exemplary embodiments. On the contrary, the invention is intended to cover not only the exemplary embodiments, but also various alternatives, modifications, equivalents and other embodiments that may be included within the spirit and scope of the invention as defined by the appended claims.

Herein, the term "coating" includes a deposited layer which is produced by sputtering a target made of a coating material, or a printed layer which is produced by printing a liquid coating material, but excludes a film which is adhered to a substrate with an adhesive interposed therebetween. The term "adhesion" includes adhesion using Pressure Sensitive Adhesive (PSA).

Figure 1:
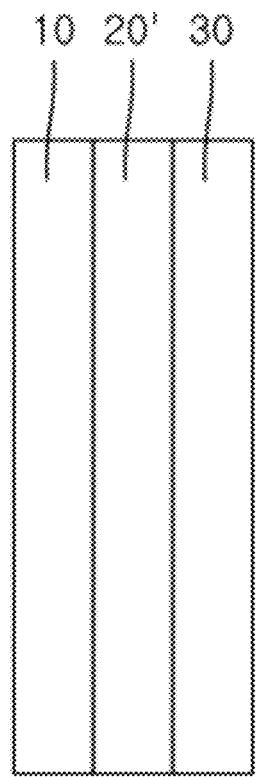
FIG. 1 is a cross-sectional view showing the structure of a multi-layered article of the related art.
Figure 2:
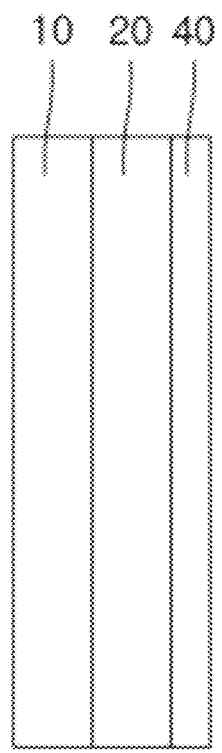
FIG. 2 is a cross-sectional view showing the structure of a multi-layered article according to a first exemplary embodiment of the present invention.

FIG. 2 is a cross-sectional view showing the structure of a multi-layered article according to a first exemplary embodiment of the present invention.

As shown in FIG. 2, the multi-layered article of this embodiment includes a substrate 10, a resin pattern layer 20 and a thin film coating layer 40. Typically, the resin pattern layer has a pattern on a surface facing away from the substrate, and the pattern is visible through the substrate. Typically, the pattern of the resin pattern layer is visible to an observer who is in front of the substrate.

The substrate 10 may be a nonmetal substrate such as glass or a polymer film. The glass may be tempered glass.

Figure 3:
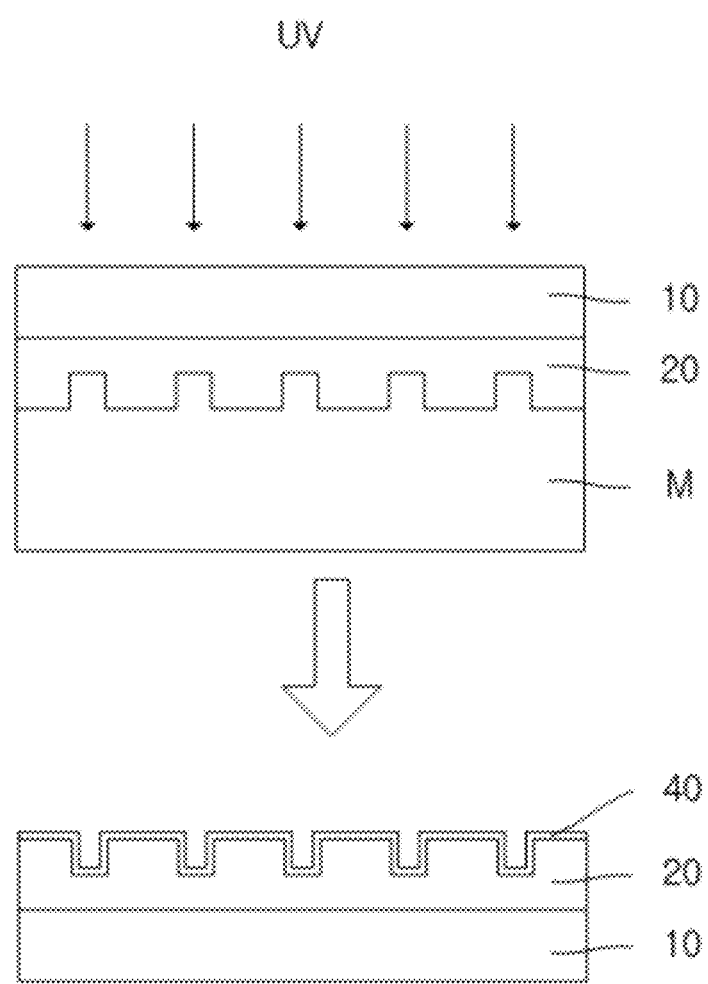
FIG. 3 is a view showing an example of the process of fabricating the multi-layered article shown in FIG. 2.

The resin pattern layer 20 is formed on the rear surface of the substrate 10. The resin pattern layer 20 has a concave-convex pattern. Here, the concave-convex pattern may include a variety of patterns, such as linear lines, nonlinear lines, hair spin, hairlines, scratches, cross hatching, textures, embossing, prisms, grooves, lenses, pillars, cones, poly-pyramids, and holes. The concave-convex pattern may be formed in various ways, typically by imprinting, as shown in FIG. 3. According to embodiments, the concave-convex pattern may be formed on only a partial area of the substrate. For example, in a mobile phone display window, the resin pattern layer and the thin film coating layer are formed only on a peripheral area of the substrate to impart a decorative effect, and a central area of the substrate functions as a simple transparent window through which a display screen can be viewed.

FIG. 3 is a view showing an example of the process of fabricating the multi-layered article shown in FIG. 2.

As shown in FIG. 3, an Ultraviolet (UV) curable resin is interposed between the substrate 10 and a mold M, and is then cured by irradiating it with UV radiation. Here, it is preferred that the substrate 10 be made of a material that can transmit UV radiation. If the substrate 10 is made of a material that cannot transmit UV radiation, the mold M should be made of a material that can transmit UV radiation.

In addition to the formation of the resin pattern layer 20 by imprinting the pattern on the UV curable resin, the resin pattern layer 20 may be formed in other various ways, as described above. For example, the resin pattern layer 20 may be formed by imprinting the pattern on a heat curable resin applied on the substrate 10. In addition, the resin pattern layer may be formed by etching the substrate or printing a color resin material or the like on the substrate.

The resin pattern layer 20 may have a three dimensional (3D) pattern. For example, the resin pattern layer 20 may have a concave-convex pattern in which the depth of concave portions and the height of the convex portions are not uniform. For this, the resin pattern layer 20 may be formed by an imprinting method using a mold having the inverse image of the 3D pattern. In addition, the resin pattern layer 20 may be formed through multi-layer coating, particularly, by setting the 2D patterns of respective layers such that they are different from each other, so that the resin pattern layer 20 has a 3D pattern. Furthermore, the resin pattern layer 20 may be formed by etching the substrate 10, particularly, by setting the etching depths of respective positions such that they are different from each other, so that the resin pattern layer 20 has a 3D pattern. That is, the resin pattern layer 20 may be an etched portion of the substrate 10.

The resin pattern layer may contain a colorant such as a pigment.

The thin film coating layer 40 may be formed on the rear surface of the resin pattern layer 20. Typically, in the multi-layered article of the present invention, the color of the thin film coating layer is exposed to the outside, thereby imparting the impression of color and feeling to the multi-layered article.

The thin film coating layer 40 may be in the form of one or multiple layers of at least one selected from among, but not limited to, metal, oxide, nitride, oxy-nitride, a thermochromic material, a photochromic material and an electrochromic material. Here, the metal includes metal alloys. The thermochromic, photochromic and electrochromic materials have characteristics that their colors change when heat, light or electricity is applied to them.

For example, the rear surface of the resin pattern layer 20 may be coated with a single layer of metal, multiple layers of metal, a single layer of oxide, or multiple layers of oxide.

In addition, the rear surface of the resin pattern layer 20 may be coated with multiple layers of metal and oxide. As an example of the thin film coating layer 40, a $NbO_x$ coating layer/aluminum doped Zinc Oxide (AZO) coating layer/Ag coating layer/AZO coating layer/$NbO_x$ coating layer may be formed one or more times, for example, 1 to 4 times.

In addition, $VO_2$ may be used as the thermochromic material. The thin film coating layer may be formed by repeating $VO_2$ thin film and $TiO_2$ film one or more times.

For example, stainless steel (such as SUS 316L), Cu, Al, Ni, Ti, Nb, Si, Cr, or the like may be used as the metal, and oxides of that metal, TiO2, $SiO_2$, $Ta_2O_5$, or the like may be used as the oxide. Nitrides of that metal may be used as the nitride. Oxynitrides of that metal may be used as the oxynitride.

It is preferred that the thin film coating layer 40 have an overall thickness ranging from 30 nm to 10 μm. More preferably, the entire thickness of the thin film coating layer ranges from 10 nm to 500 nm.

It is preferred that the thin film coating layer 40 be formed by sputtering. In addition, the thin film coating layer 40 may be formed by E-beam evaporation or resistive heating. Sputtering is preferable, since the color of the thin film coating layer may be adjusted depending on the amount of various gases (such as oxygen or nitrogen) that are injected as an atmosphere.

Table 1 below presents the sputtering conditions.

TABLE 1

| Substrate heating temp | 100° C. (10 mins) |
| Process pressure | 2.0 to 3.0 mtorr |
| Ar | 100 sccm |
| Velocity of carrier | 33/65/130 cm/min |
| Film thickness | 30/60/120 nm |

Figure 4:
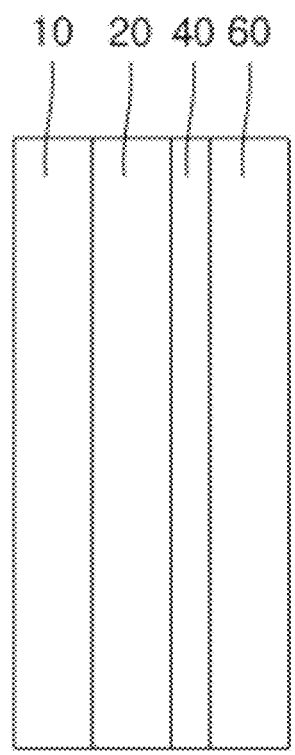
FIG. 4 is a cross-sectional view showing the structure of a multi-layered article according to a second exemplary embodiment of the present invention.

FIG. 4 is a cross-sectional view showing the structure of a multi-layered article according to a second exemplary embodiment of the present invention.

Figure 11:
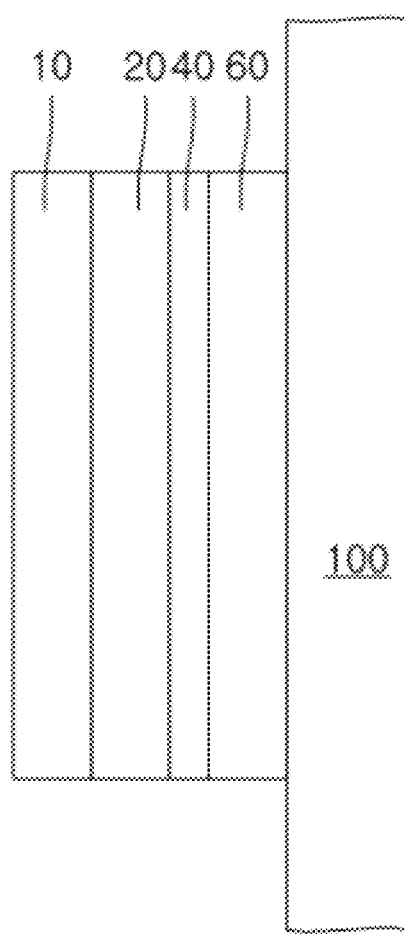
FIG. 11 is a cross-sectional view showing the usage of the multi-layered article shown in FIG. 4, which is attached to a home appliance.
Figure 12:
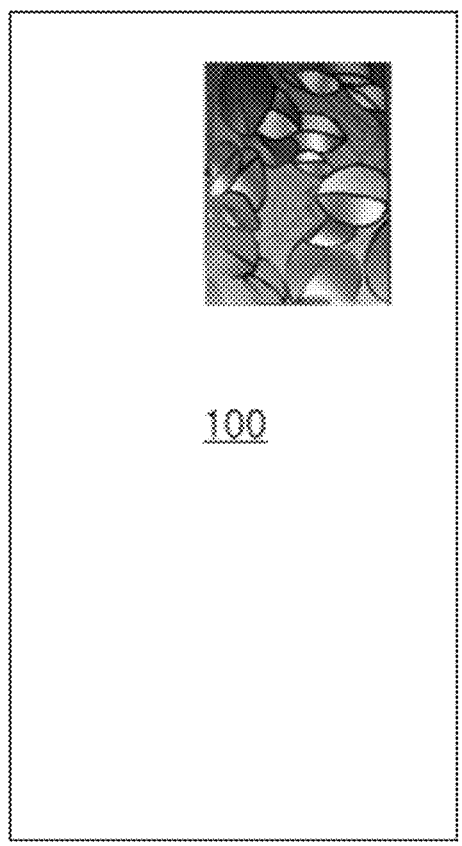
FIG. 12 is a front elevation view of FIG. 11.

As shown in FIG. 4, the multi-layered article of this embodiment includes a protective film 60 on the rear surface of the thin film coating layer 40. The protective film 60 not only ensures physical durability by preventing scratches on the thin film coating layer 40, but also enables the thin film coating layer 40 to maintain chemical stability. The multi-layered article is typically attached to a home appliance, as shown in FIGS. 11 and 12, using a polyurethane adhesive. Accordingly, the protective film 60 may function to improve chemical resistance by blocking a chemical reaction between the polyurethane adhesive and the thin film coating layer 40.

The protective film 60 may be transparent or have an achromatic or chromatic color. For example, if there is an undesirable possibility that the color of the adhesive on the rear surface of the protective film may be exposed through the front surface of the multi-layered article in some embodiments, the protective film 60 may be provided with a white color such that the color of the adhesive is not exposed through the front surface.

Figure 6:
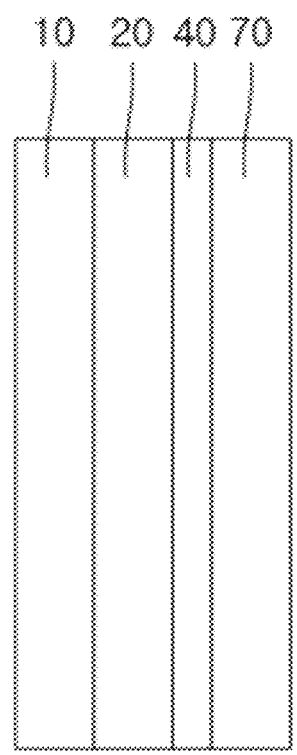
FIG. 6 is a cross-sectional view showing the structure of a multi-layered article according to a third exemplary embodiment of the present invention.

FIG. 6 is a cross-sectional view showing the structure of a multi-layered article according to a third exemplary embodiment of the present invention.

The multi-layered article of this embodiment has a first protective coating layer 70 in place of the protective film 60 shown in FIG. 4. The first protective coating layer may be formed by, for example, Chemical Vapor Deposition (CVD) or sputtering, using one material selected from among, but not limited to, $Si_3N_4$, SiC, NbOx, TiN, Ti and DLC.

Figure 7:
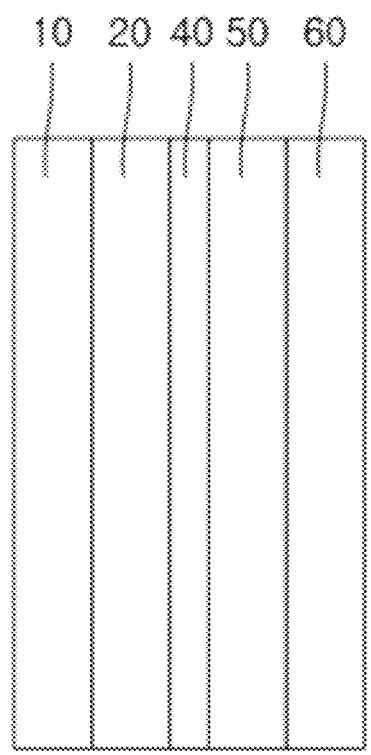
FIG. 7 is a cross-sectional view showing the structure of a multi-layered article according to a fourth exemplary embodiment of the present invention.

FIG. 7 is a cross-sectional view showing the structure of a multi-layered article according to a fourth exemplary embodiment of the present invention.

As shown in FIG. 7, the multi-layered article of this embodiment may also include a second protective coating layer 50 between the thin film coating layer 40 and the protective film 60.

Similarly, the second protective coating layer 50 may be interposed between the thin film coating layer according to the embodiment shown in FIG. 6 and the first protective coating layer 70.

Figure 5:
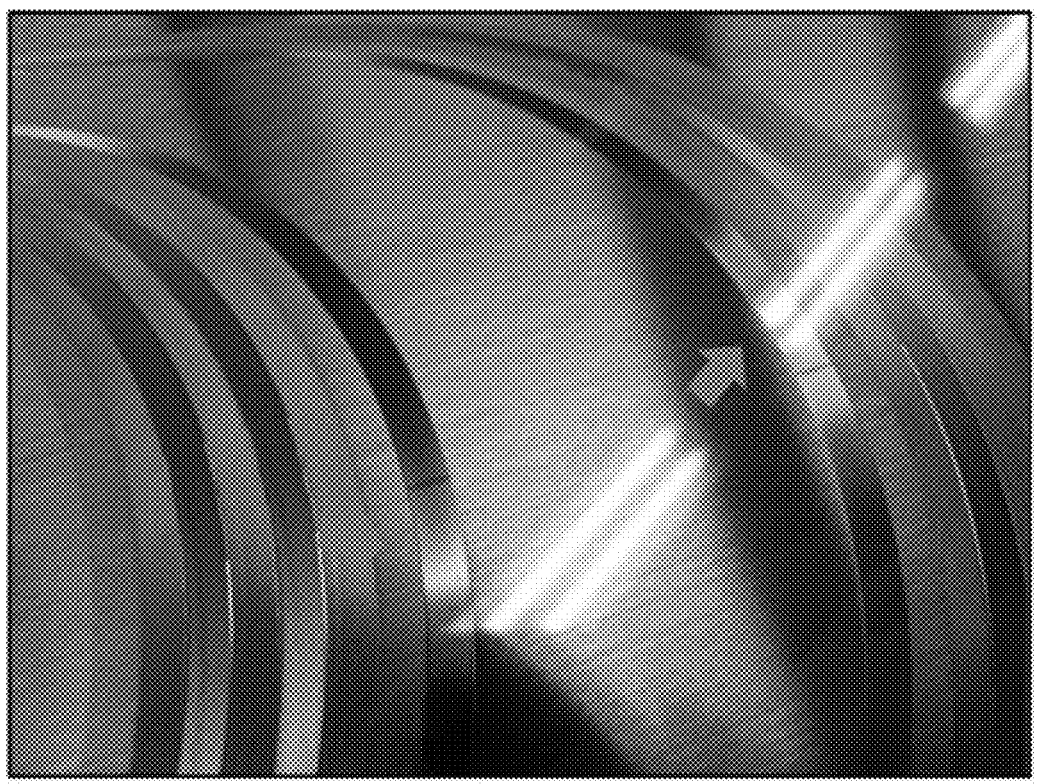
FIG. 5 is a picture showing a defect that may occur in the multi-layered article shown in FIG. 4.

A heat resistance test (65° C., a relative humidity of 90%, 72 hours) and a moisture resistance test (relative humidity of 90%, 48 hours) performed on the multi-layered article shown in FIG. 4 revealed that a defect in a rainbow shape, as shown in FIG. 5, would occur. It was discovered that the defect occurred due to a difference in refractive indices which is caused by moisture penetration into the resin pattern layer of the UV resin. Accordingly, as shown in FIG. 7, the second protective coating layer 50, for example, the second protective coating layer of $NbO_x$ was formed in order to prevent the defect.

Figure 9:
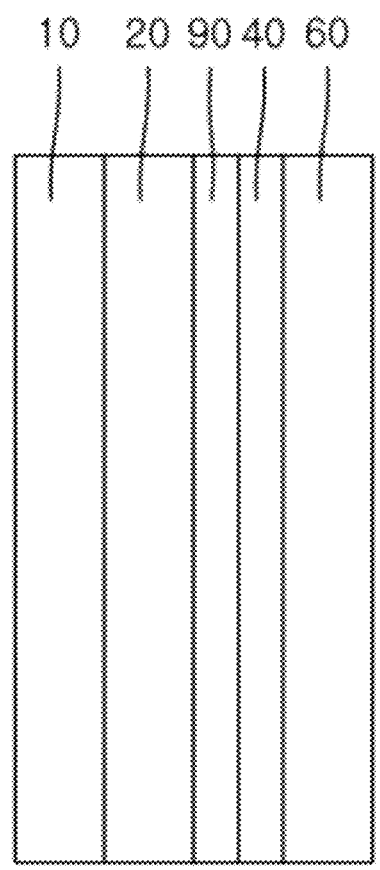
FIG. 9 is a cross-sectional view showing the structure of a multi-layered article according to a fifth exemplary embodiment of the present invention.

FIG. 9 is a cross-sectional view showing the structure of a multi-layered article according to a fifth exemplary embodiment of the present invention.

As shown in FIG. 9, the multi-layered article includes a substrate 10, a resin pattern layer 20, a primer coating layer 90, a thin film coating layer 40 and a protective film 60. The protective film 60 may be omitted according to another embodiment. Also the multi-layered article shown in FIG. 9 may have the first protective coating layer in place of the protective film and, in addition, the second protective coating layer.

The primer coating layer 90 may contain at least one selected from among, but not limited to, Ti, Nb, Si, TiOx, NbOx and SiOx.

It is preferred that the thickness of the primer coating layer range from 5 nm to 500 n.

As the primer coating layer, a layer that is deposited by sputtering may be preferable but a printed layer may not be preferable. This is because, in the latter method, it is difficult to apply the primer coating layer to an intended thickness.

Figure 8:
FIG. 8 is a picture showing a defect that may occur in the multi-layered article shown in FIG. 7.

A heat resistance test and a moisture resistance test, which were performed on the multi-layered article shown in FIG. 7, revealed that the defect in a rainbow shape could be restrained but a defect of the difference in local colors would occur in the multi-layered article, as shown in FIG. 8. It is discovered that the difference in colors occurred since the thin film coating layer, particularly, the thin film coating layer 40 which was subjected to sputtering under the condition in which oxygen was injected, resulted in a chemical reaction with the resin pattern layer 20 made of a UV resin. It was also discovered that the pollution of the resin pattern layer 20 prior to the formation of the thin film coating layer 40 deepened the defect. The present invention was able to restrain such defects by forming the primer coating layer 90, as shown in FIG. 9.

Figure 10:
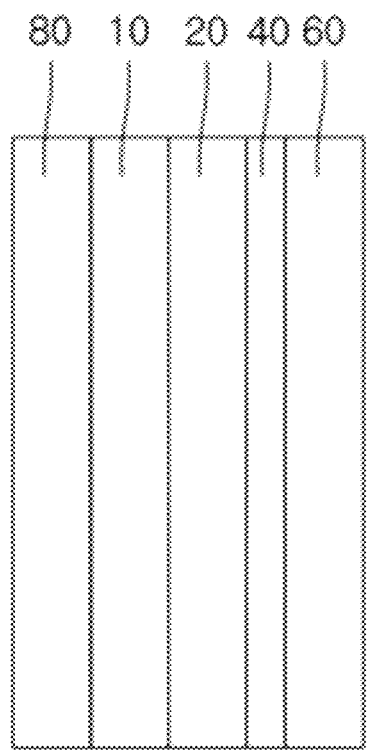
FIG. 10 is a cross-sectional view showing the structure of a multi-layered article according to a sixth exemplary embodiment of the present invention.

FIG. 10 is a cross-sectional view showing the structure of a multi-layered article according to a sixth exemplary embodiment of the present invention.

As shown in FIG. 10, the multi-layered article of this embodiment includes an anti-pollution coating layer 80 in the front thereof. The anti-pollution coating layer 80 may contain at least one selected from among, but not limited to, $MgF_2$ (which is a fluorine compound), Polytetrafluroethylene (PTFE) (which is a fluorine compound), Diamond Like Carbon (DLC) and $TiO_2$. In addition, the effect of the anti-pollution coating layer 80 may be enhanced by doping a small amount of dopant thereinto. The anti-pollution coating layer functions as a hydrophilic material, a photocatalyst, or the like to prevent the multi-layered article from being polluted.

In another embodiment, the protective film 60 may be omitted. The multi-layered article shown in FIG. 10 may have a first protective coating layer in place of the protective film, and may further have a second protective coating layer.

FIG. 11 is a cross-sectional view showing the usage of the multi-layered article shown in FIG. 4, which is attached to a home appliance, and FIG. 12 is a front elevation view of FIG. 11.

FIGS. 11 and 12 show an embodiment in which the multi-layered article of the present invention is attached to a refrigerator 100. In this embodiment, it is required that at least the substrate and the resin pattern layer be not opaque in order that the pattern of the resin pattern layer 20 is visible to the user.

Although the multi-layered article of the present invention may be typically attached to the outer surface of, for example, home appliances, the multi-layered article is not intended to be limited thereto. For example, the multi-layered article may be attached to the surface of an indoor wall to form part of an interior design. In addition, although the multi-layered article of the present invention attached to home appliances has been described so far as the major embodiment, it is of course not intended to be limited thereto. For example, the multi-layered article of the present invention may be applicable to other various fields, such as mobile phones, household goods, furniture, building windows, vehicles, and the like.

The foregoing descriptions of specific exemplary embodiments of the present invention have been presented for the purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the claims appended hereto and their equivalents.

What is claimed is:

1. A method of fabricating a multi-layered article comprising:
    forming a resin pattern layer on a substrate such that the resin pattern layer has a pattern on a surface that faces away from the substrate, the pattern of the resin pattern layer being visible through the substrate; and
    depositing a thin film coating layer by sputtering, E-beam evaporation or resistive heating, directly on the surface of the resin pattern layer that faces away from the substrate such that the resin pattern layer, and the thin film coating layer are sequentially layered on the substrate, the color of the thin film coating layer being exposed through the resin pattern layer and the substrate to the outside, wherein the thin film coating layer comprises a $NbO_x$ thin film, an aluminum doped zinc oxide (AZO) thin film, an Ag thin film, an aluminum doped zinc oxide (AZO) thin film and a $NbO_x$ thin film, which are repeated one or more times.

2. The method of claim 1, wherein the thin film coating layer has a thickness ranging from 3 nm to 10 µm.

3. The method of claim 2, wherein the thin film coating layer has a thickness ranging from 10 nm to 500 nm.

4. The method of claim 1, wherein the resin pattern layer comprises an ultraviolet curable resin or a heat curable resin that has a concave-convex pattern formed therein.

5. The method of claim 1, wherein the resin pattern layer comprises a color resin material that is printed on the substrate.

6. The method of claim 1, wherein the resin pattern layer comprises a colorant.

7. The method of claim 1, wherein the resin pattern layer has a three-dimensional pattern.

8. The method of claim 1, further comprising adhering a protective film to or layering a first protective coating layer on a surface of the thin film coating layer that faces away from the resin pattern layer.

9. The method of claim 8, wherein the first protective coating layer is a printed layer.

10. The method of claim 8, wherein the first protective coating layer comprises at least one selected from the group consisting of $Si_3N_4$, SiC, NbOx, TiN, Ti and DLC.

11. The method of claim 8, further comprising forming a second protective coating layer between the thin film coating layer and the protective film or between the thin film coating layer and the first protective coating layer.

12. The method of claim 11, wherein the second protective coating layer comprises at least one selected from the group consisting of Ti, $TiO_2$, Si, SiO2, $Ta_2O_5$, Nb and $NbO_x$.

13. The method of claim 1, further comprising layering an anti-pollution coating layer on a surface of the substrate that faces away from the resin pattern layer.

14. The method of claim 13, wherein the anti-pollution coating layer comprises at least one selected from the group consisting of $MgF_2$, polytetrafluroethylene, diamond-like carbon and $TiO_2$.

15. A method of fabricating a multi-layered article comprising:
   forming a resin pattern layer on a substrate such that the resin pattern layer has a pattern on a surface that faces away from the substrate, the pattern of the resin pattern layer being visible through the substrate;
   depositing a primer coating layer by sputtering, directly on the surface of the resin pattern layer that faces away from the substrate, the color of the primer coating layer being exposed through the resin pattern layer and the substrate to the outside; and
   forming a thin film coating layer on the primer coating layer such that the resin pattern layer, the primer coating layer and the thin film coating layer are sequentially layered on the substrate,
   wherein the thin film coating layer comprises a $NbO_x$ thin film, an aluminum doped zinc oxide (AZO) thin film, an Ag thin film, an aluminum doped zinc oxide (AZO) thin film and a $NbO_x$ thin film, which are repeated one or more times.

16. The method of claim 15, wherein the primer coating layer comprises at least one selected from the group consisting of Ti, Nb, Si, TiOx, NbOx and SiOx.

17. The method of claim 15, wherein the primer coating layer has a thickness ranging from 5 nm to 500 nm.

* * * * *